United States Patent
Jung

(10) Patent No.: US 7,650,373 B2
(45) Date of Patent: Jan. 19, 2010

(54) SOURCE DRIVER WITH MULTI-CHANNEL SHIFT REGISTER

(75) Inventor: Tae-Ho Jung, Chungcheongbuk-do (KR)

(73) Assignee: MagnaChip Semiconductor, Ltd., Chungcheonbuk-Do (KR)

( * ) Notice: Subject to any disclaimer, the term of this patent is extended or adjusted under 35 U.S.C. 154(b) by 927 days.

(21) Appl. No.: 11/218,222

(22) Filed: Aug. 31, 2005

(65) Prior Publication Data

US 2006/0050837 A1 Mar. 9, 2006

(30) Foreign Application Priority Data

Sep. 1, 2004 (KR) .................... 10-2004-0069490

(51) Int. Cl.
*G06F 7/00* (2006.01)
*G06F 15/00* (2006.01)
*G11C 19/00* (2006.01)

(52) U.S. Cl. .................. 708/209; 377/64; 377/75; 377/77

(58) Field of Classification Search .............. 377/64, 377/69; 365/78, 98, 99, 100; 711/109; 708/252, 708/209

See application file for complete search history.

(56) References Cited

U.S. PATENT DOCUMENTS 5,504,913 A * 4/1996 Baden .................. 711/100
6,333,730 B1 * 12/2001 Lee ....................... 345/100
6,914,956 B2 * 7/2005 Kawasaki et al. ........... 377/68
6,946,310 B2 * 9/2005 Koyama .................... 438/27
7,095,396 B2 * 8/2006 Ohta et al. .................. 345/94
2004/0130542 A1 * 7/2004 Tanada ..................... 345/204

FOREIGN PATENT DOCUMENTS

| JP | 2001-034236 | 2/2001 |
|----|-------------|--------|
| JP | 2002-313092 | 10/2002 |
| KR | 2000-0066354 | 11/2000 |
| KR | 2005-0007195 | 1/2005 |
| KR | 2005-0066945 | 6/2005 |

* cited by examiner

*Primary Examiner*—Lewis A Bullock, Jr.
*Assistant Examiner*—Kevin Hughes
(74) *Attorney, Agent, or Firm*—Blakely, Sokoloff, Taylor & Zafman LLP

(57) ABSTRACT

A source driver for use in a display device having a shift register unit for sequentially activating output signals. The shift register unit includes a plurality of shift registers connected in series, wherein Nth shift register among the plurality of shift registers selects one of an output of a (N−1)th shift register and an output of a (N−A)th shift register according to a channel selection signal to thereby receive the selected signal, where A is a natural number which is greater than or equal to 2.

16 Claims, 9 Drawing Sheets

SOURCE DRIVER WITH MULTI-CHANNEL SHIFT REGISTER

FIELD OF INVENTION

The present invention relates to a source driver for use in a thin film transistor-liquid crystal display (TFT-LCD); and, more particularly, to a source driver capable of adjusting the number of channels.

DESCRIPTION OF PRIOR ART

FIG. 1 is a block diagram showing a conventional thin film transistor-liquid crystal display (TFT-LCD).

As shown, the conventional TFT-LCD includes a timing control unit 100; a plurality of gate drivers, e.g., 200; a plurality of source drivers, e.g., 300; a TFT-LCD panel 400; and a voltage generator 500.

The plurality of gate drivers are controlled by the timing control unit 100 in order to sequentially drive gate lines of the TFT-LCD panel 400. Similarly, the plurality of source drivers are controlled by the timing control unit 100 to thereby drive source lines of the TFT-LCD panel 400 so that the TFT-LCD panel 400 display image data.

The TFT-LCD panel 400 includes a plurality of unit pixels arranged in a matrix form. Each of the unit pixels includes a thin film transistor T1 and a capacitor C1. A source of the thin film transistor T1 is connected to a source line operated by the source driver 300 and a gate of the thin film transistor T1 is connected to a gate line operated by the gate driver 200.

The timing control unit 100 controls the gate driver 200 to sequentially drive a corresponded gate line. The source driver 300 receives data outputted from the timing control unit 100 to thereby generate an analog signal and input the generated analog signal to a source line. In this manner, the TFT-LCD panel 400 displays image data.

FIG. 2 is a block diagram depicting the source driver 300.

As shown, the source driver 300 includes a digital control unit 310; a register unit 320 for storing a digital data signal outputted from the digital control unit 310; a level shifter unit 330 for controlling a level of a signal outputted from the register unit 320; a digital to analog converter 340 for converting a digital signal outputted from the level shifter unit 330 to an analog signal; a analog bias unit 350; and a buffering unit 360 for buffering an output of the digital to analog converter 340 according to a bias generated by the analog bias unit 350 to thereby input the buffered signal to the source line.

The digital control unit 310 receives a source driver start pulse (SSP), a data clock and a digital data from the timing control unit 100 to thereby transfer the digital data to the register unit 320 and control the register unit 320.

The register unit 320 includes a shift register unit 321, a sampling register unit 322 and a holding register unit 323.

Each digital data is stored to a sampling register by a shift register. The digital data stored in the sampling register is transferred to the digital to analog converter 340 through a holding register and a level shifter in response to a control signal LOAD outputted from the timing control unit 100.

Herein, the register unit 320 is operated at a low voltage, e.g., 3.3V; however, the digital to analog converter 340 and the buffering unit 360 are operated at a high voltage, e.g., 6 to 12V. Therefore, the level shifter unit 330 controls a level of a signal outputted from the register unit 320.

The digital to analog converter 340 includes a gamma reference unit 342 for making an input voltage nonlinear to thereby linearly display brightness of light; and a decoding unit 344 for selecting one of a plurality of gamma reference output signals outputted from the gamma reference unit 342 according to the digital signal outputted from the level shifter unit 330 to thereby output the selected signal as an analog signal.

FIG. 3 is a block diagram illustrating the shift register unit 321.

As shown, the shift register unit 321 includes a plurality of flip-flops connected in series, i.e., 321a to 321e. Each flip-flop activates its output signal in response to an output of a preceding flip-flop. A first flip-flop, i.e., 321a or 321e, receives an output of the digital control unit 321.

Meanwhile, according to a direction selection signal UP, the plurality of flip-flops are sequentially activated from 321a to 321e or from 321e to 321a.

FIG. 4 is a schematic circuit diagram showing the flip-flop 321a.

As shown, the flip-flop 321a includes a selection unit 1 for selecting one of a right input signal IR and a left input signal IL according to the direction selection signal UP; a flip-flop element 2 for receiving an output of the selection unit 1 in synchronization with a clock signal CLK; and a buffer unit 3 for buffering an output of the flip-flop element 2 to thereby generate a first active signal OUT and a second active signal SEQ.

The flip-flop element 2 receives one of the right input signal IR and the left input signal IL in synchronization with the clock signal CLK. Thereafter, the buffer unit 3 buffers the output of the flip-flop element 2 to thereby generate the first active signal OUT and a first active bar signal OUTB for activating each sampling register and the second active signal SEQ for activating a next flip-flop.

Meanwhile, since channels of the source driver are one-to-one matched to sub-pixels of a panel, the number of the channels included in the source driver is determined according to a resolution of the panel. For instance, when the resolution of a color panel is 1024×768, the number of column lines is 1024 and the number of sub-pixels is 3072 (=1024×3) Therefore, each source driver must include 384 channels on the assumption that 8 source drivers are included in the color panel.

Accordingly, a source driver having 384 channels can be used for only a color panel having a particular resolution, i.e., a resolution of 1024×768 or a resolution of integral multiple of 384. That is, since the channels included in the source driver are physically fixed, the source driver should be re-designed in order to be used in a color panel having another resolution.

SUMMARY OF INVENTION

It is, therefore, an object of the present invention to provide a source driver for controlling the number of channels using a software method.

In accordance with an aspect of the present invention, there is provided a source driver having a shift register unit for sequentially activating output signals, the shift register unit including a plurality of shift registers connected in series, wherein Nth shift register among the plurality of shift registers selects one of an output of a (N−1)th shift register and an output of a (N−A)th shift register according to a channel selection signal to thereby receive the selected signal, where A is a natural number which is greater than or equal to 2.

In accordance with another aspect of the present invention, there is provided a source driver having a shift register unit including a plurality of flip-flops each of which selects one of a first input data and a second input data in response to a first channel selection signal and a second channel selection signal and outputs the selected signal in synchronization with a clock signal, the source driver including: a first flip-flop for receiving a start signal as a fist and a second input data and for receiving a first control signal as a first and a second channel selection signals; a second flip-flop for receiving an output of the first flip-flop as a first and a second input data and for receiving a second control signal as a first and a second channel selection signals; a third flip-flop for receiving an output of the second flip-flop as a first and a second input data and for receiving a third control signal as a first and a second channel selection signals; a fourth flip-flop for receiving an output of the third flip-flop and the output of the second flip-flop as a first input data and a second input data respectively and for receiving a fourth control signal and the third control signal as a first channel selection signal and a second channel selection signal; a fifth flip-flop for receiving an output of the fourth flip-flop as a first and a second channel selection signals and for receiving an inverted second control signal as a first and a second channel selection signals; a sixth flip-flop for receiving an output of the fifth flip-flop and the output of the second flip-flop as a first input data and a second input data respectively and for receiving the second control signal and the inverted second control signal as a first channel selection signal and a second channel selection signal respectively; and a seventh flip-flop for receiving an output of the sixth flip-flop as a first and a second input data and for receiving the first control signal as a first and a second channel selection signals.

In accordance with further another aspect of the present invention, there is provided a source driver having a shift register unit including a plurality of flip-flops each of which selects one of a first input data and a second input data as a left input data and one of a third input data and a fourth input data as a right input data in response to a first channel selection signal and a second channel selection signal in order to select one of the left input data and the right input data according to a direction selection signal and output the selected signal in synchronization with a clock signal, the source driver including: a first flip-flop for receiving a start signal as a first and a second input data and for receiving an output of a second flip-flop and an output of a third flip-flop as a third input data and a fourth input data respectively and for receiving a first control signal as a first and a second channel selection signals; the second flip-flop for receiving an output of the first flip-flop as a first and a second input data and for receiving the output of the third flip-flop as a third and a fourth input data and for receiving a second control signal as first and a second channel selection signals; the third flip-flop for receiving the output of the second flip-flop and the output of the first flip-flop as a first input data and a second input data respectively and for receiving an output of a fourth flip-flop as a third and a fourth input data and for receiving the second control signal and an inverted second control signal as a first channel selection signal and a second channel selection signal respectively; and the fourth flip-flop for receiving the output of the third flip-flop as a first and a second input data and for receiving the start signal as a third and a fourth input data and for receiving the first control signal as a first and a second channel selection signals, wherein each of the first to the fourth flip-flops receives a same clock signal and a same direction selection signal.

In accordance with further another aspect of the present invention, there is provided a multi-channel shift register having a plurality of flip-flops connected in series, each of the flip-flops selects one of a first input data and a second input data in response to a first channel selection signal and a second channel selection signal and outputs the selected signal in synchronization with a clock signal, the multi-channel shift register including: a first flip-flop for receiving a start signal as a fist and a second input data and for receiving a first control signal as a first and a second channel selection signals; a second flip-flop for receiving an output of the first flip-flop as a first and a second input data and for receiving a second control signal as a first and a second channel selection signals; a third flip-flop for receiving an output of the second flip-flop as a first and a second input data and for receiving a third control signal as a first and a second channel selection signals; a fourth flip-flop for receiving an output of the third flip-flop and the output of the second flip-flop as a first input data and a second input data respectively and for receiving a fourth control signal and the third control signal as a first channel selection signal and a second channel selection signal; a fifth flip-flop for receiving an output of the fourth flip-flop as a first and a second channel selection signals and for receiving an inverted second control signal as a first and a second channel selection signals; a sixth flip-flop for receiving an output of the fifth flip-flop and the output of the second flip-flop as a first input data and a second input data respectively and for receiving the second control signal and the inverted second control signal as a first channel selection signal and a second channel selection signal respectively; and a seventh flip-flop for receiving an output of the sixth flip-flop as a first and a second input data and for receiving the first control signal as a first and a second channel selection signals.

In accordance with further another aspect of the present invention, there is provided a multi-channel shift register having a plurality of flip-flops each of which selects one of a first input data and a second input data as a left input data and one of a third input data and a fourth input data as a right input data in response to a first channel selection signal and a second channel selection signal in order to select one of the left input data and the right input data according to a direction selection signal and output the selected signal in synchronization with a clock signal, the multi-channel shift register including: a first flip-flop for receiving a start signal as a first and a second input data and for receiving an output of a second flip-flop and an output of a third flip-flop as a third input data and a fourth input data respectively and for receiving a first control signal as a first and a second channel selection signals; the second flip-flop for receiving an output of the first flip-flop as a first and a second input data and for receiving the output of the third flip-flop as a third and a fourth input data and for receiving a second control signal as first and a second channel selection signals; the third flip-flop for receiving the output of the second flip-flop and the output of the first flip-flop as a first input data and a second input data respectively and for receiving an output of a fourth flip-flop as a third and a fourth input data and for receiving the second control signal and an inverted second control signal as a first channel selection signal and a second channel selection signal respectively; and the fourth flip-flop for receiving the output of the third flip-flop as a first and a second input data and for receiving the start signal as a third and a fourth input data and for receiving the first control signal as a first and a second channel selection signals, wherein each of the first to the fourth flip-flops receives a same clock signal and a same direction selection signal.

BRIEF DESCRIPTION OF THE DRAWINGS

The above and other objects and features of the present invention will become apparent from the following description of preferred embodiments taken in conjunction with the accompanying drawings, in which.

DETAILED DESCRIPTION OF INVENTION

Hereinafter, a source driver in accordance with the present invention will be described in detail referring to the accompanying drawings.

Figure 5:
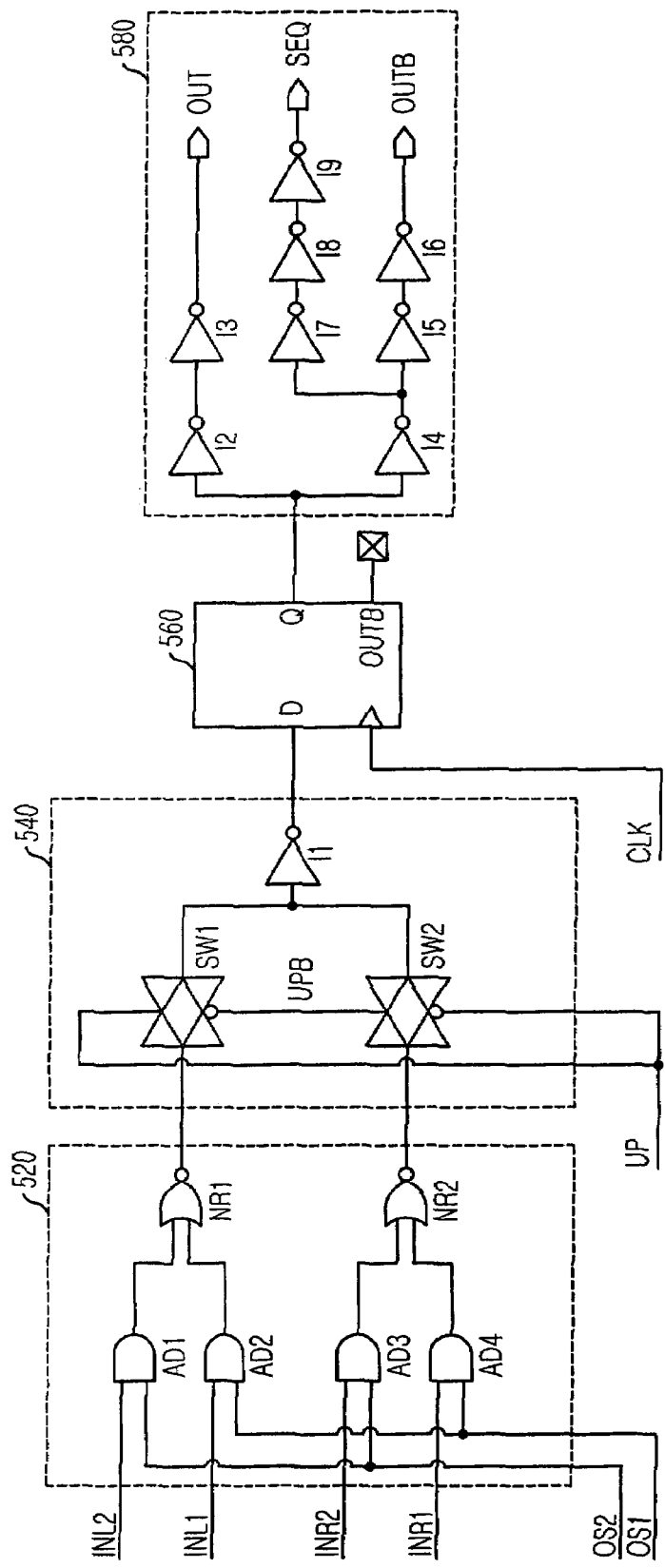
FIG. 5 is a schematic circuit diagram showing a flip-flop for use in a shift register included in a source driver in accordance with a preferred embodiment of the present invention.

FIG. 5 is a schematic circuit diagram showing a flip-flop for use in a shift register included in a source driver in accordance with a preferred embodiment of the present invention.

As shown, the flip-flop includes an input data selection unit 520; a direction selection unit 540; a flip-flop element 560; and a buffer unit 580.

The input data selection unit 520 outputs one of a first input data INL1 and a second input data INL2 as a left input data in response to a first channel selection signal OS1 and a second channel selection signal OS2. The input data selection unit 520 also outputs one of a third input data INR1 and a fourth input data INR2 as a right input data in response to the first channel selection signal OS1 and the second channel selection signal OS2.

The direction selection unit 540 selects one of the left input data and the right input data according to a direction selection signal UP and a direction selection bar signal UPB to thereby output the selected signal.

The flip-flop element 560 receives an output of the direction selection unit 540 in synchronization with a clock signal CLK.

The buffer unit 580 buffers an output of the flip-flop element 560 to thereby generate a first active signal OUT and a second active signal SEQ.

In detail, the input data selection unit 520 includes a first AND gate AD1 for receiving the second input data INL2 and the second channel selection signal OS2; a second AND gate AD2 for receiving the first input data INL1 and the first channel selection signal OS1; a third AND gate AD3 for receiving the fourth input data INR2 and the second channel selection signal OS2; a fourth AND gate AD4 for receiving the third input data INR1 and the first channel selection signal OS1; a first NOR gate NR1 for generating the left input data by performing a logic NOR operation to and output of the first AND gate AD1 and an output of the second AND gate AD2; and a second NOR gate NR2 for generating the right input data by performing a logic NOR operation to an output of the third AND gate AD3 and an output of the fourth AND gate AD4.

The direction selection unit 540 includes a first switch SW1 for transferring the left input data in response to the direction selection signal UP; a second switch SW2 for transferring the right input data in response to the direction selection bar signal UPB; and a first inverter for inverting a voltage loaded on a node commonly coupled to an output of the first switch SW1 and an output of the second switch SW2.

The buffer unit 580 includes a second and a third inverters I2 and I3 for delaying an output of the flip-flop element 560 to thereby generate the first active signal OUT; a fourth inverter I4 for inverting the output of the flip-flop element 560; a seventh to a ninth inverters I7 to I9 for generating the second active signal SEQ by inverting and delaying an output of the fourth inverter I4; and a fifth and a sixth inverters I5 and I6 for generating an inverted version of the first active signal OUT, i.e., a first active bar signal OUTB, by delaying the output of the fourth inverter I4.

Meanwhile, by using the above-described flip-flop, a multi-channel shift register, whose activation direction can be controlled, can be embodied. That is, the multi-channel shift register can be activated from left to right or from right to left. Therefore, in case of a shift register which is activated in a single direction, a flip-flop dose not need to receive the third input data INR1 and the fourth input data INR2. Accordingly, a single-direction flip-flip does not need to include the third AND gate AD3, the fourth AND gate AD4 and the second switch SW2. Further, the first and the second switches SW1 and SW2 for selecting one of the left input data and the right input data are not required.

An operation of the flip-flop shown in FIG. 5 is described below.

The input data selection unit 520 outputs one of the first and the second input data INL1 and INL2 as the left input data and outputs one of the third and the fourth input data INR1 and INR2 as the right input data in response to the first and the second channel selection signals OS1 and OS2.

Thereafter, the direction selection unit 540 selects one of the left input data and the right input data in response to the direction selection signal UP and inputs the selected signal to the flip-flop element 560. Then, the flip-flop element 560 outputs the selected signal in synchronization with the clock signal CLK.

Thereafter, the buffer unit 580 receives an output of the flip-flop element 560 to thereby generate the first active signal OUT, the first active bar signal OUTB and the second active signal SEQ.

Herein, when the first channel selection signal OS1 is in a logic high level, the input data selection unit 520 selects the first input data INL1 in order to output the left input data and selects the third input data INR1 in order to output the right input data. On the contrary, when the second channel selection signal OS2 is in a logic high level, the input data selection unit 520 selects the second input data INL2 in order to output the left input data and selects the fourth input data INR1 in order to output the right input data.

When both the first and the second channel selection signals OS1 and OS2 are inactivated, an output of the flip-flop is inactivated. Therefore, in case that a shift register is embodied by using a plurality of the above-mentioned flip-flop, the number of output signals can be controlled according to the first and the second channel selection signals OS1 and OS2.

Figure 6:
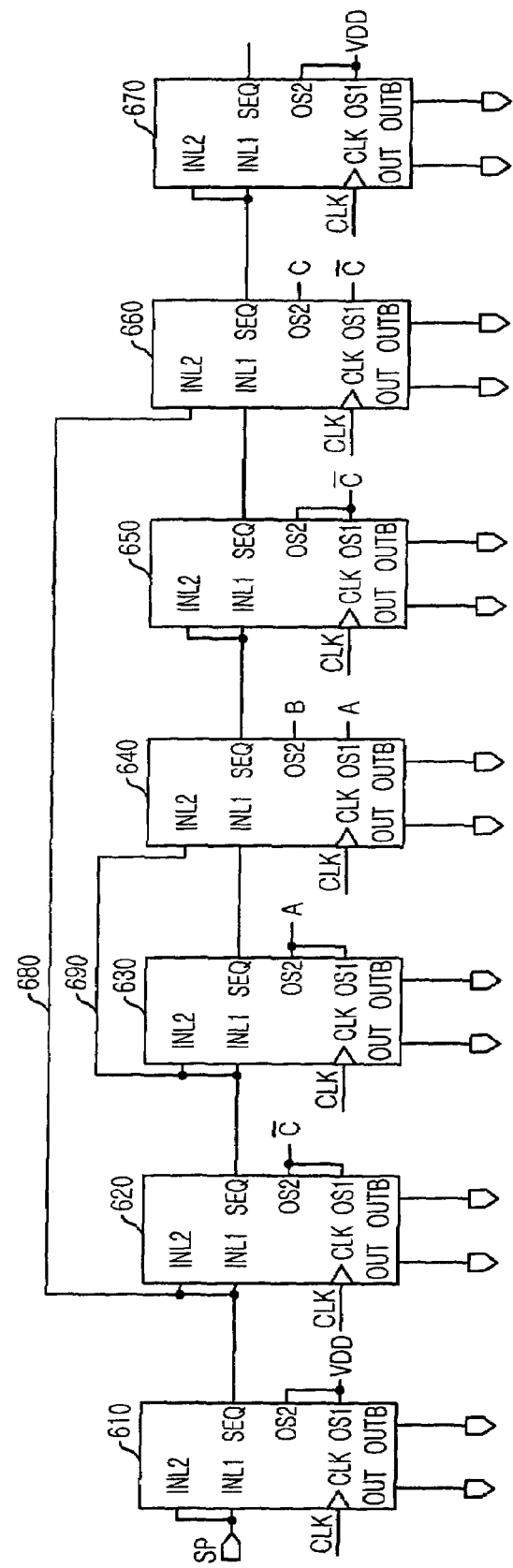
FIG. 6 is a block diagram showing a shift register embodied by using 7 single-direction flip-flops.

FIG. 6 is a block diagram showing a shift register embodied by using 7 single-direction flip-flops. The shift register shown in FIG. 6 is an exemplary shift register capable of controlling the number of output signals by using a control signal. Herein, it is assumed that the shift register is operated in a single-direction.

Referring to FIG. 6, the shift register includes a first to a sixth flip-flops 610 to 670.

The first flip-flop 610 receives a start signal SP as a first input data IN1 and a second input data IN2 and also receives a power supply voltage VDD as a first channel selection signal OS1 and a second channel selection signal OS2. The second flip-flop 620 receives an output signal SEQ from the first flip-flop 610 as a first input data IN1 and a second input data IN2 and also receives a third control bar signal/C as a first channel selection signal OS1 and a second channel selection signal OS2. Herein, the third control bar signal/C is an inverted version of a third control signal C.

The third flip-flop 630 receives an output signal SEQ from the second flip-flop 620 as a first input data IN1 and a second input data IN2 and also receives a first control signal A as a first channel selection signal OS1 and a second channel selection signal OS2. The fourth flip-flop 640 receives an output of the third flip-flop and an output of the second flip-flop as a first input data IN1 and a second input data IN2 respectively and also receives a first control signal A and a second control signal B as a first channel selection signal OS1 and a second channel selection signal OS2 respectively.

The fifth flip-flop 650 receives an output signal SEQ from the fourth flip-flop 640 as a first input data IN1 and a second input data IN2 and also receives the third control bar signal/C as a first channel selection signal OS1 and a second channel selection signal OS2. The sixth flip-flop 660 receives an output of the fifth flip-flop 650 and the output of the first flip-flop 610 as a first input data IN1 and a second input data IN2 respectively and also receives the third control signal C and the third control bar signal/C as a second channel selection signal OS2 and a first channel selection signal OS1.

The seventh flip-flop 670 receives an output of the sixth flip-flop 660 as a first input data IN1 and a second input data IN2 and also receives the power supply voltage VDD as a first channel selection signal OS1 and a second channel selection signal OS2.

Meanwhile, the second to the fifth flip-flops 620 to 650 under bypass lines 680 and 690 are selectively inactivated according to the number of output signals being controlled by the first, the second and the third control signals A, B and C. That is, since a flip-flop activates its output signal in response to an output of a preceding flip-flop, an output of a flip-flop is transferred to a flip-flop located next to an inactivated flip-flop to thereby activate the flip-flop.

Herein, the first flip-flop 610, the sixth flip-flop and the seventh flip-flop 670 are always activated regardless of the number of output signals by receiving the power supply voltage VDD as the first channel selection signal OS1 and the second channel selection signal OS2. That is, since the first and the second channel selection signal OS1 and OS2 are always activated as a logic high level due to the power supply voltage VDD, the first flip-flop 610, the sixth flip-flop and the seventh flip-flop 670 are always activated to be operated in response to the first input data IN1 and the second input data IN2.

In addition, the first to the seventh flip-flops 610 to 670 receive a clock signal CLK in order to activate output signals OUT and SEQ.

Meanwhile, Table. 1 shows the number of output signals of the shift register according to the control signals inputted as the channel selection signals.

TABLE 1

| Number of output signals | A | B | C | /C |
|---|---|---|---|---|
| #7 | H | L | L | H |
| #5 | L | H | L | H |
| #3 | L | L | H | L |

When the number of output signals is 3, the third control signal C is in a logic high level and the other control signals, i.e., A, B and/C, are in a logic low level. Accordingly, the second to the fifth flip-flops 620 to 650 are inactivated.

When the number of output signals is 5, the second control signal B is in a logic high level and the first and the third control signals A and C are in a logic low level. Therefore, the third flip-flop 630 is inactivated.

In case that the number of output signals is 7, the first control signal A is in a logic high level and the second and the third control signals B and C are in a logic low level. Therefore, one of the first and the second channel selection signals OS1 and OS2 is in a logic high level. Accordingly, all of the first to the seventh flip-flops 610 to 670 are enabled to thereby activate output signals of the first to the seventh flip-flops 610 to 670.

By using the above-mentioned method, not only the number of output signals but also multi-channels according to the bypass lines can be formed.

Figure 1:
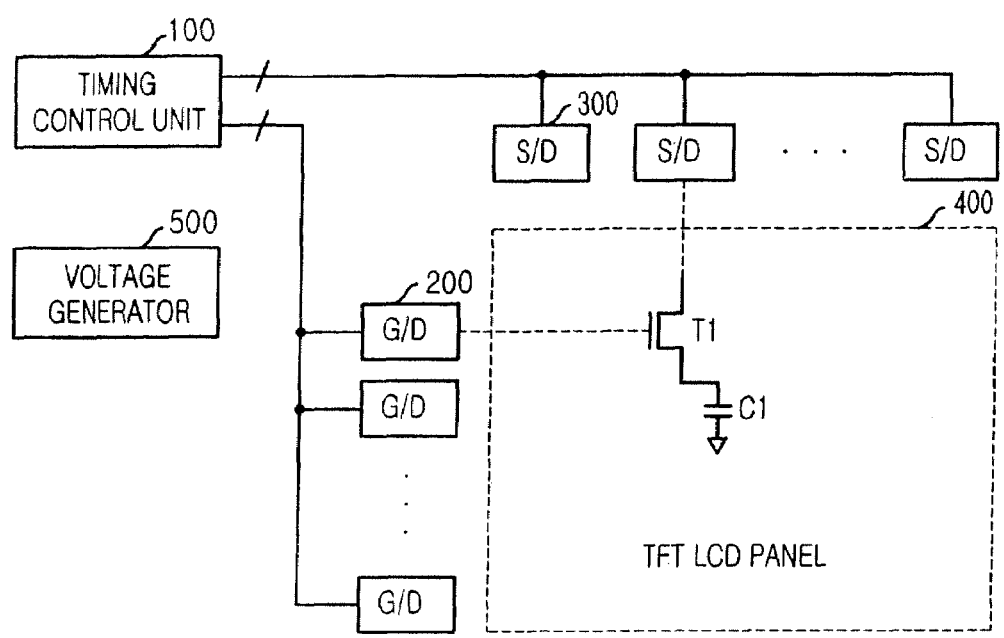
FIG. 1 is a block diagram showing a conventional thin film transistor-liquid crystal display (TFT-LCD)
Figure 2:
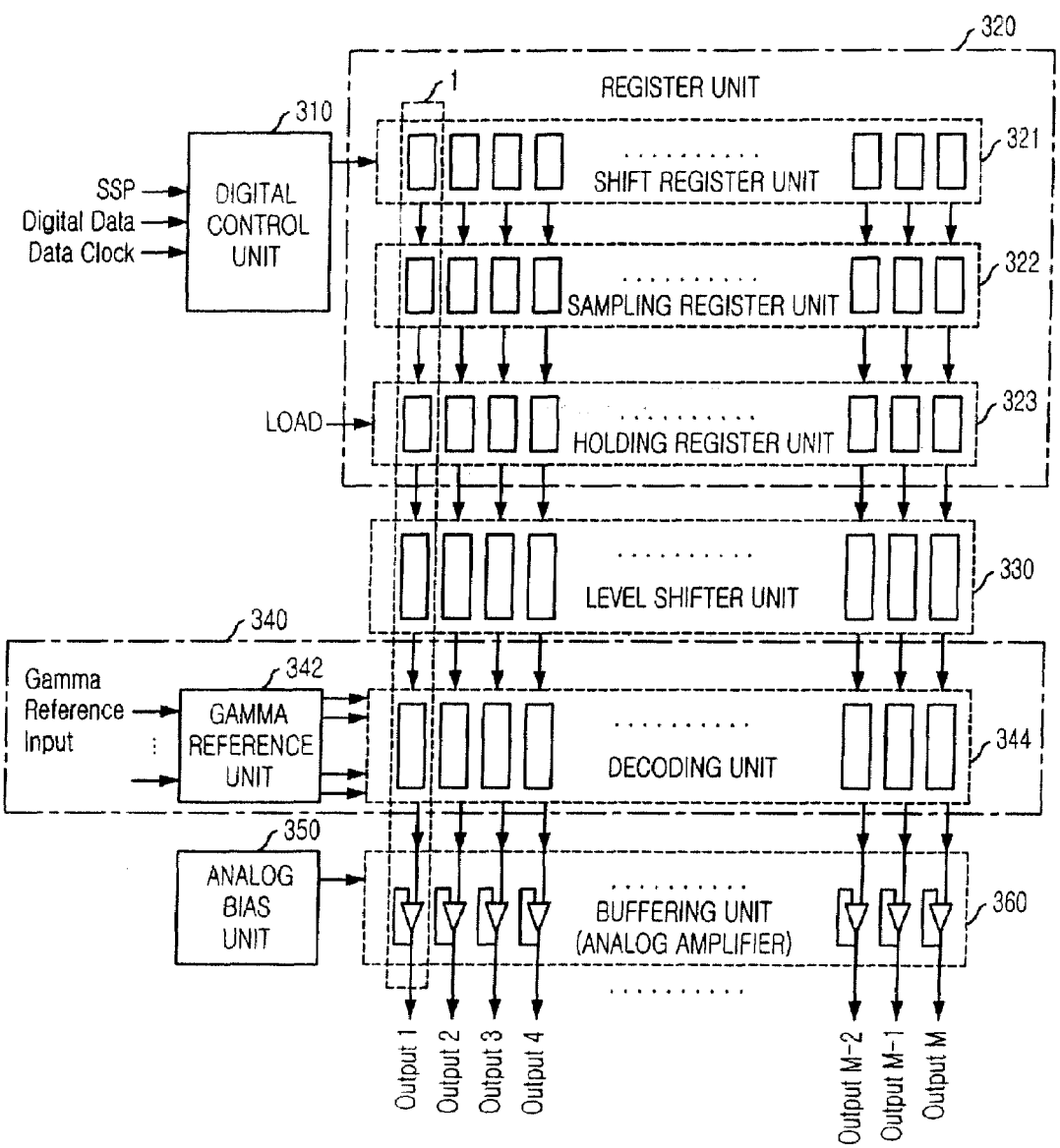
FIG. 2 is a block diagram depicting a source driver shown in FIG. 1.
Figure 3:
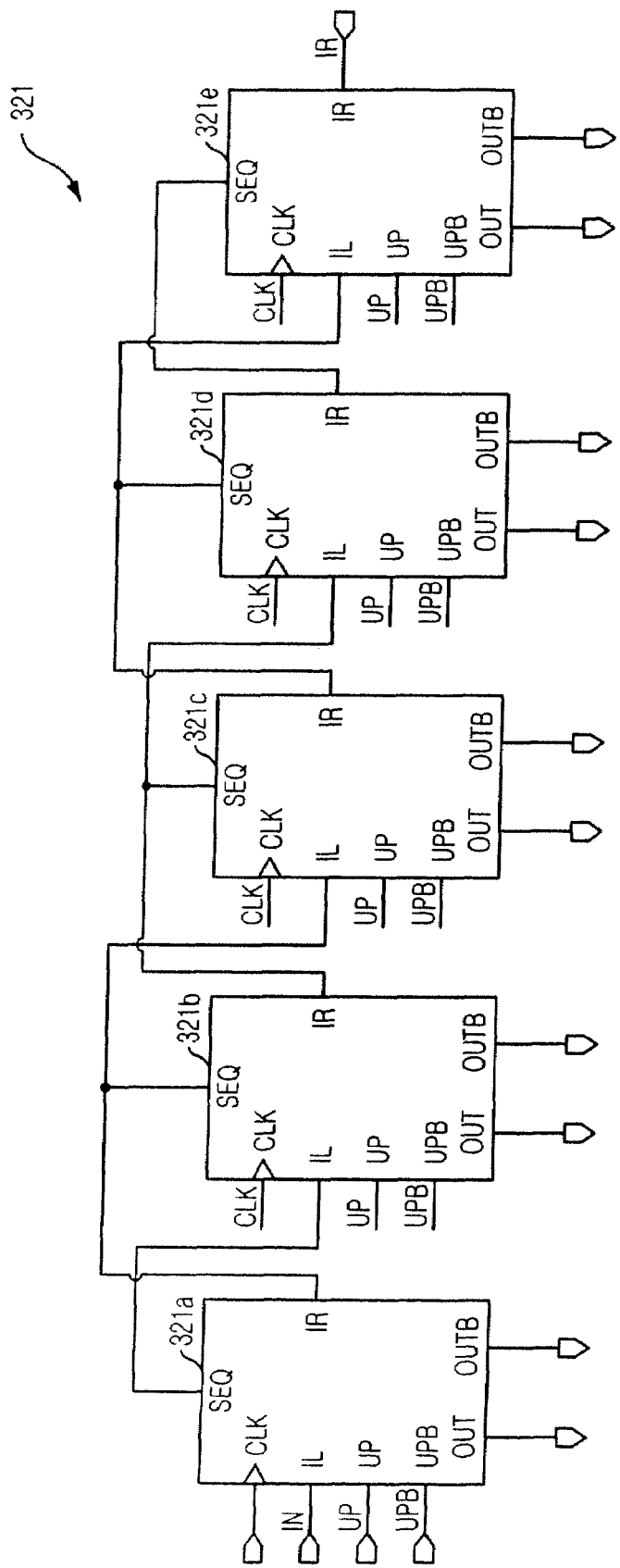
FIG. 3 is a block diagram illustrating a shift register unit shown in FIG. 2.
Figure 4:
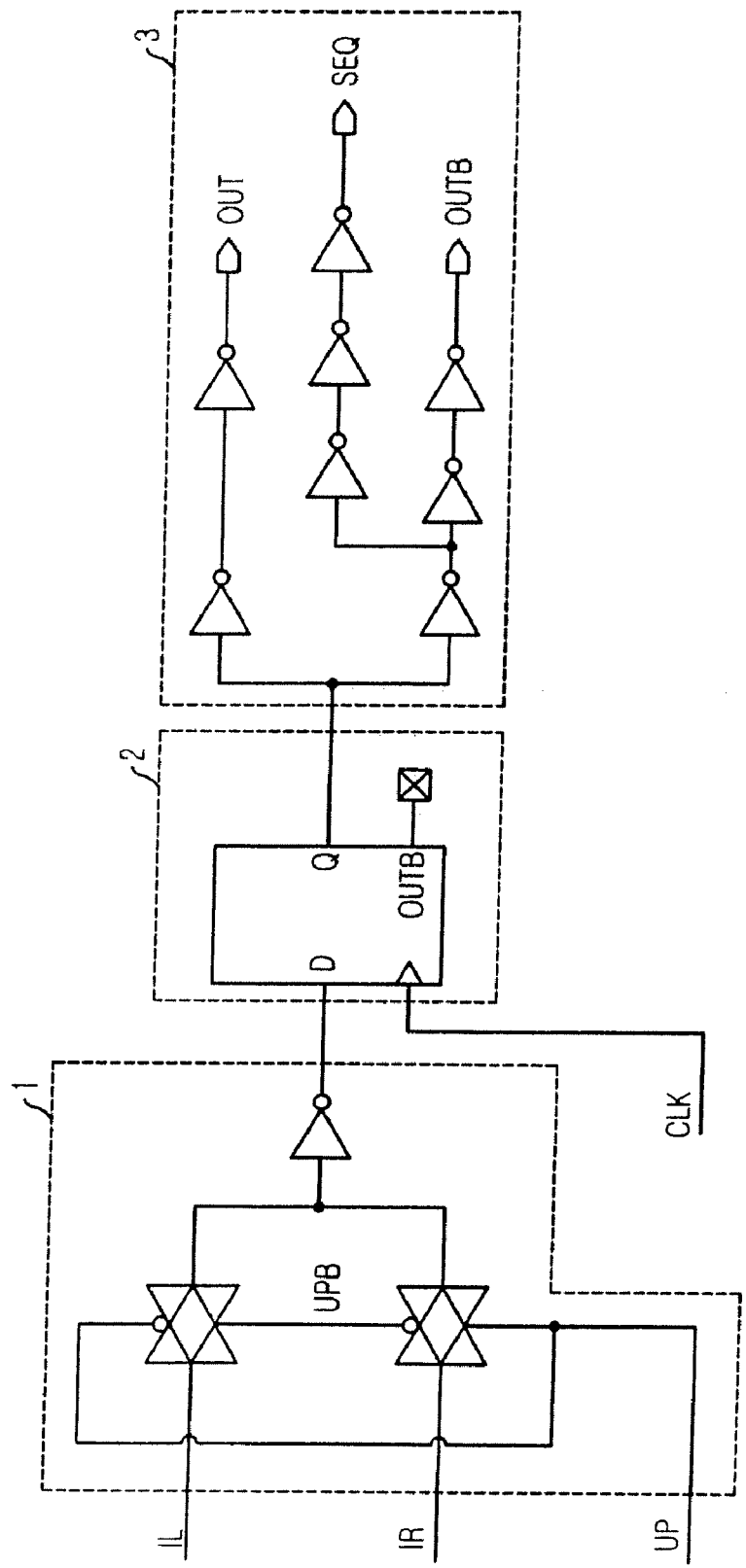
FIG. 4 is a schematic circuit diagram showing a flip-flop shown in FIG. 3.

Meanwhile, the output signals of the shift registers are used as activation signals of sampling registers included in a sampling register unit (shown in FIG. 2). Therefore, by controlling the number of output signals of the shift register, the number of channels of a source driver can be controlled.

Accordingly, by using the above-mentioned shift register for the source driver, the number of channels of the source driver can be controlled according to a control signal.

Figure 7:
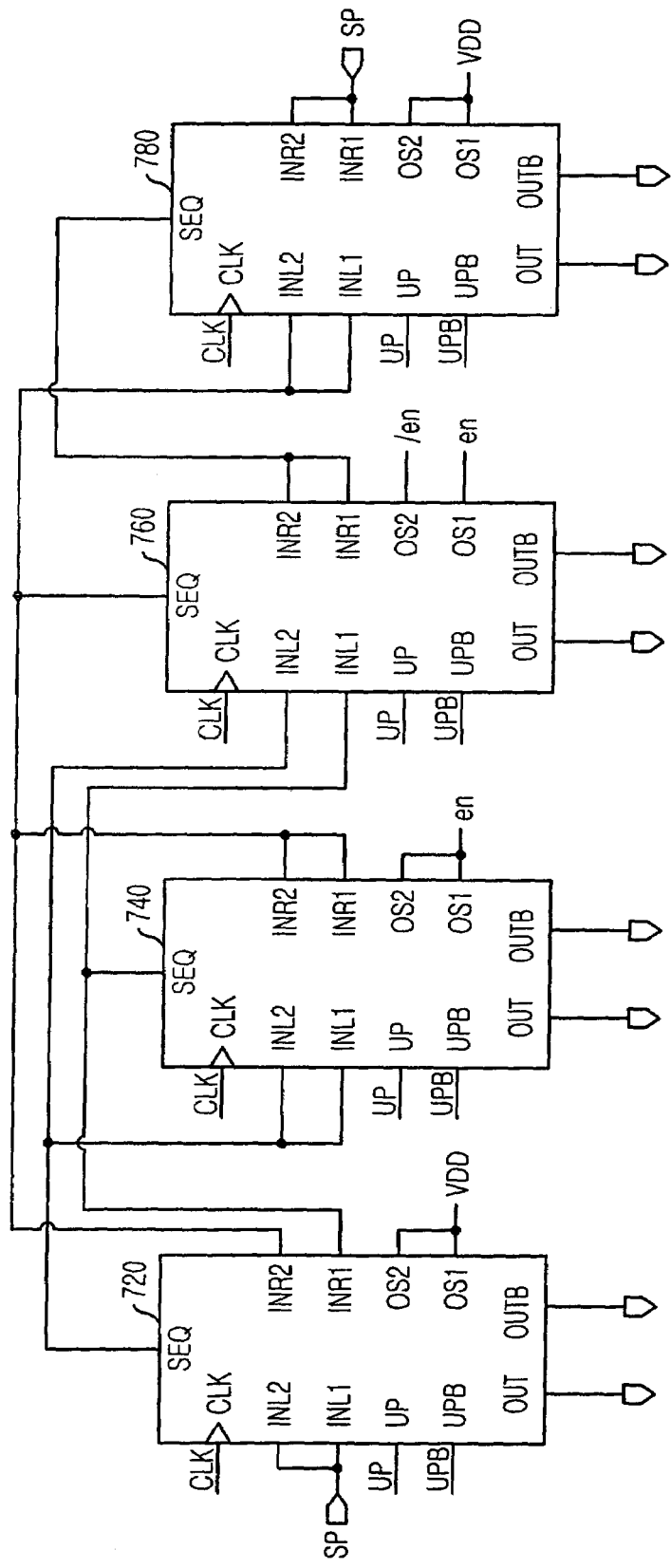
FIG. 7 is a block diagram showing a bi-directional multi-channel shift register embodied by using 4 flip-flops shown in FIG. 5.

FIG. 7 is a block diagram showing a bi-directional multi-channel shift register embodied by using 4 flip-flops shown in FIG. 5. The number of output signals of the bi-directional multi-channel shift register can be controlled according to a control signal.

As shown, the bi-directional multi-channel shift register includes a first to a fourth flip-flops 720 to 780.

The first flip-flop 720 receives a start signal SP as a first input data INL1 and a second input data INL2. The first flip-flop 720 also receives an output signal SEQ of the second flip-flop 740 and an output signal SEQ of the third flip-flop 760 as a third input data INR1 and a fourth input data INR2 respectively. The second flip-flop 740 receives an output signal SEQ of the first flip-flop 720 as a first input data INL1 and a second input data INL2 and also receives the output signal SEQ of the third flip-flop 760 as a third input data INR1 and a fourth input data INR2.

The third flip-flop 760 receives the output signal SEQ of the second flip-flop 740 and an output signal SEQ of the first flip-flop 720 as a first input data INL1 and a second input data INL2 respectively. The third flip-flop 760 also receives an output signal SEQ of the fourth flip-flop 780 as a third input data INR1 and a fourth input data INR2. The fourth flip-flop 780 receives the output signal SEQ of the third flip-flop 760 as a first input data INL1 and a second input data INL2. The fourth flip-flop 780 also receives the start signal SP as a third input data INR1 and a fourth input data INR2.

Herein, a control signal en is inputted to a first channel selection signal OS1 and a second channel selection signal OS2 of the second flip-flop 740. The third flip-flop 760 receives the control signal en and a control bar signal/en as a first channel selection signal OS1 and a second channel selection signal OS2 respectively.

Meanwhile, the first flip-flop 720 receives a power supply voltage VDD as a first channel selection signal OS1 and a second channel selection signal OS2. Likewise, the fourth flip-flop 780 receives the power supply voltage VDD as a first channel selection signal OS1 and a second channel selection signal OS2. Therefore, the first and the second flip-flops 720 and 780 activate output signals according to input signals regardless of the control signals.

In addition, each of the first to the fourth flip-flops 720 to 780 receives a clock signal CLK a first direction selection signal UP and a second direction selection signal UPB.

Meanwhile, a multi-channel shift register includes 4 flip-flops, and all the 4 flip-flops are activated when the control signal en is in a logic high level, and thus 4 output signals are outputted. On the contrary, when the control signal en is in a logic low level, 3 output signals are outputted since the second flip-flop 740 is inactivated.

An operation of the bi-directional multi-channel shift register is described below.

It is assumed that the output signals of the flip-flops included in the bi-directional multi-channel shift register are sequentially activated from left to right and the control signal en and the first direction selection signal UP are respectively in a logic low level and a logic high level.

When the start signal SP is activated, the first flip-flop 720 receives the start signal SP in synchronization with the clock signal CLK to thereby activate output signals SEQ and OUT. However, output signals SEQ and OUT of the second flip-flop 740 are inactivated by the control signal en.

Thereafter, the third flip-flop 760 receives the output signal SEQ of the first flip-flop 720 as the second input data INL2 in response to the control signal en in synchronization with the clock signal CLK to thereby activate output signals OUT and SEQ. Similarly, the fourth flip-flop 780 receives the output signal SEQ of the third flip-flop 760 in synchronization with the clock signal CLK in order to activate output signals OUT and SEQ.

Meanwhile, when the first direction selection signal UP is in a logic low level, the output signals of the flip-flops included in the bi-directional multi-channel shift register are activated from right to left receiving the third input data INR1 and the fourth input data INR2.

Figure 8:
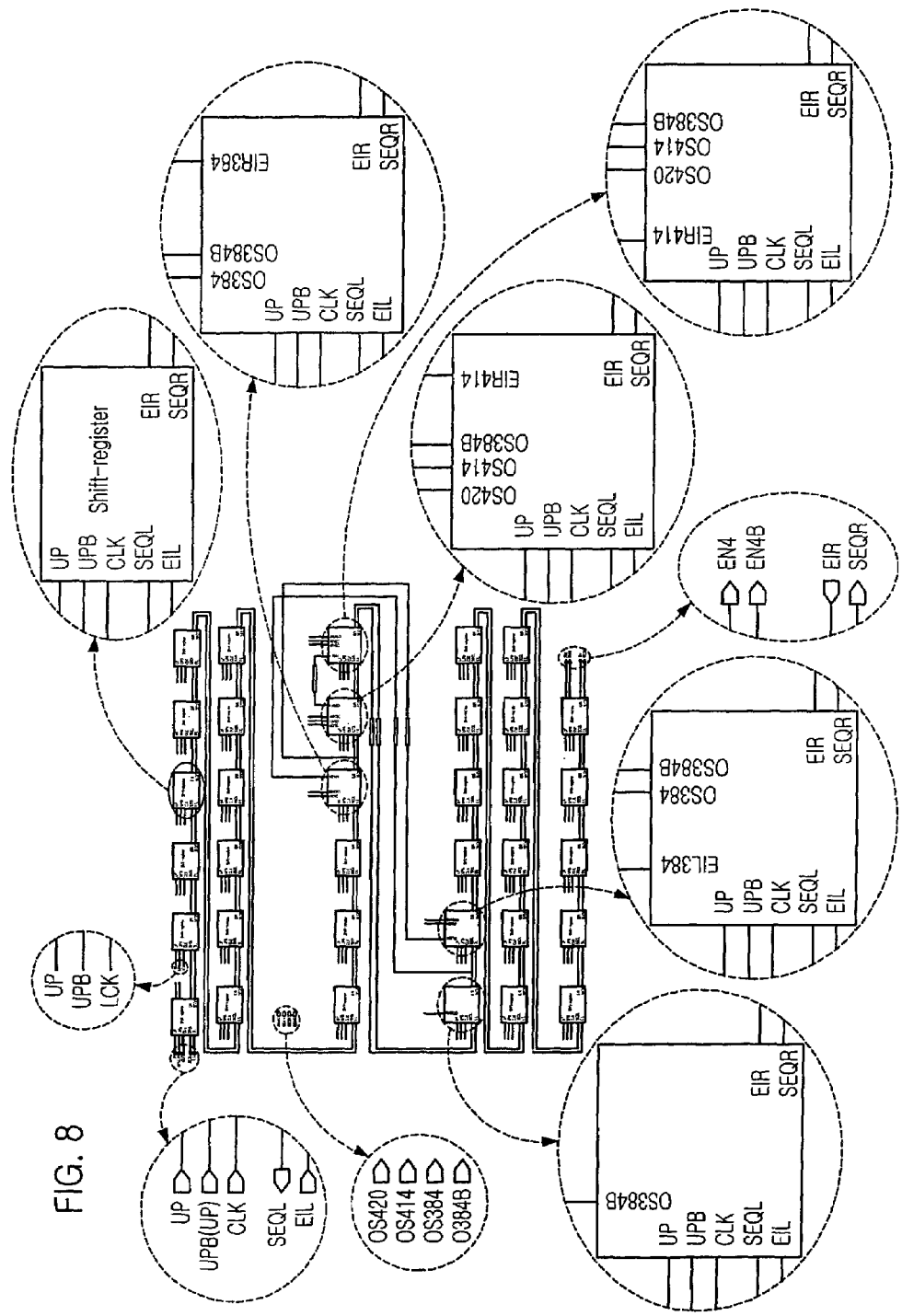
FIG. 8 is a block diagram showing a bi-directional multi-channel shift register unit in accordance with a third embodiment of the present invention.

FIG. 8 is a block diagram showing a bi-directional multi-channel shift register unit in accordance with a third embodiment of the present invention.

In case that a source driver is embodied by using the bi-directional multi-channel shift register unit shown in FIG. 8, the source driver has three different number of output signals, i.e., 384, 414 and 420.

Figure 9:
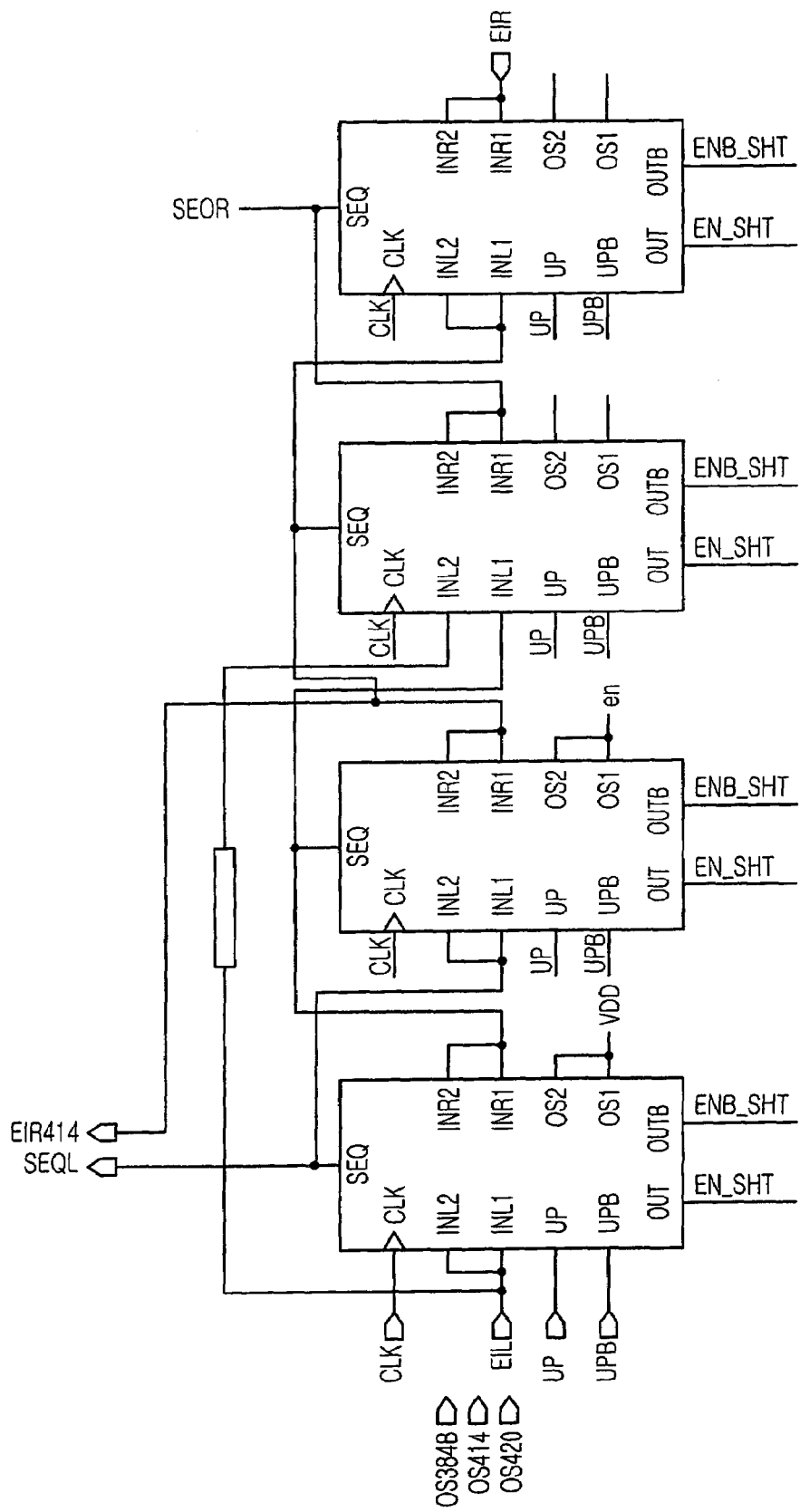
FIG. 9 is a block diagram showing a bi-directional multi-channel shift register included in the bi-directional multi-channel shift register unit shown in FIG. 8.

FIG. 9 is a block diagram showing a bi-directional multi-channel shift register included in the bi-directional multi-channel shift register unit shown in FIG. 8.

Referring to FIGS. 8 and 9, the bi-directional multi-channel shift register unit includes a plurality of shift registers connected in series. Herein, each of the plurality of shift registers includes 4 flip-flops.

Meanwhile, since each flip-flop controls three channels, each shift register controls 12 channels. Therefore, when all of the shift registers are activated, 420 channels are activated. In case that two registers are inactivated, 414 channels are activated since 6 channels are inactivated. When 6 shift registers are inactivated, 384 channels are activated since 36 channels are inactivated. The different numbers of channels are substantial to be applied to various resolutions of a display product such as a liquid crystal display (LCD).

Meanwhile, the source driver including the multi-channel shift register in accordance with the present invention can control the number of channels by using a control signal. That is, according to the prior art, after a conventional source driver is manufactured, the conventional source driver is required to be full-ware revised in order to change the channel sections when the number of channels is not compatible with a resolution of a thin film transistor-LCD (TFT-LCD). However, the channel sections of the source driver according to the present invention can be changed by revising a metal-line layer without revising other layers under a contact.

Accordingly, the source driver in accordance with the present invention can be applied to various active matrix displays such as the TFT-LCD and an organic light emitting display (OLED).

The present application contains subject matter related to Korean patent application No. 200-, filed in the Korean Patent Office on, 2004, the entire contents of which being incorporated herein by reference.

While the present invention has been described with respect to the particular embodiments, it will be apparent to those skilled in the art that various changes and modifications may be made without departing from the spirit and scope of the invention as defined in the following claims.

What is claimed is:

1. A source driver for activating plural output signals comprising a plurality of shift registers coupled in series, wherein Nth shift register among the plurality of shift registers receives both an output of a (N−1)th shift register and an output of a (N−A)th shift register and selects one of the output of a (N−1)th shift register and the output of a (N−A)th shift register according to a channel selection signal, where the A and the N are natural numbers which are greater than or equal to 2 wherein each output signal of the (N−A+1)th to (N−1)th shift registers is inactivated when the Nth shift register selects the output of the (N−A)th shift register in response to an activation of the channel selection signal, wherein the shift register receives one of the output of the (N−1)th shift register and the output of the (N−A)th shift register as a left input signal in response to the channel selection signal, or receives one of an output of a (N−1)th shift register and an output of a (N+A)th shift register as a right input signal in response to the channel selection signal; and wherein the shift register includes: an input data selection unit for outputting inputted signals as the left input signal and the fight input signal in response to the channel selection signal; a direction selection unit for selecting one of the left input signal and the right input signal in response to a direction selection signal and for outputting the selected signal; a plurality of flip-flops, each receiving an output signal of the direction selection unit in synchronization with a clock signal; and a buffer unit for generating a first active signal and an inverted first active signal by buffering an output signal of the flip-flop to thereby activate a sampling register unit and for generating a second active signal to thereby activate a next shift register wherein each of said plurality of flip flops receives as an input an output of another one of said plurality of flip flops.

2. The source driver as recited in claim 1, wherein the input data selection unit includes:
a first AND gate for receiving the output of the (N−1)th shift register and a first channel selection signal;
a second AND gate for receiving the output of the (N−A)th shift register and the second channel selection signal;
a third AND gate for receiving the output of the (N+1)th shift register and the first channel selection signal;

a fourth AND gate for receiving the output of the (N+A)th shift register and the second channel selection signal;

a first NOR gate for receiving an output of the first AND gate and an output of the second AND gate to thereby generate the left input signal; and a second NOR gate for receiving an output of the third AND gate and an output of the fourth AND gate to thereby generate the right input signal.

3. The source driver as recited in claim 1, wherein the direction selection unit includes;

a first switch for transferring the right input signal according to the direction selection signal;

a second switch for transferring the left input signal according to an inverted direction selection signal; and a first inverter for inverting an output signal outputted from a node commonly coupled by an output of the first switch and an output of the second switch.

4. The source driver as recited in claim 3, wherein the buffer unit includes:

a second and a third inverters for generating the first active signal by delaying the output signal of the flip-flop;

a fourth inverter for inverting the output signal of the flip-flop;

a fifth and a sixth inverters for generating the inverted first active signal by delaying an output of the fourth inverter, and a seventh to a ninth inverters for generating the second active signal by inverting and delaying the output of the fourth inverter.

5. A source driver having a shift register unit including a plurality of flip-flops each of which selects one of a first input data and a second input data in response to a first channel selection signal and a second channel selection signal and outputs the selected signal in synchronization with a clock signal, the source driver comprising:

a first flip-flop for receiving a start signal as a first and a second input data and for receiving a first control signal as a first and a second channel selection signals;

a second flip-flop for receiving an output of the first flip-flop as a first and a second input data and for receiving a second control signal as a first and a second channel selection signals;

a third flip-flop for receiving an output of the second flip-flop as a first and a second input data and for receiving a third control signal as a first and a second channel selection signals;

a fourth flip-flop for receiving an output of the third flip-flop and the output of the second flip-flop as a first input data and a second input data respectively and for receiving a fourth control signal and the third control signal as a first channel selection signal and a second channel selection signal;

a fifth flip-flop for receiving an output of the fourth flip-flop as a first and a second channel selection signals and for receiving an inverted second control signal as a first and a second channel selection signals;

a sixth flip-flop for receiving an output of the fifth flip-flop and the output of the first flip-flop as a first input data and a second input data respectively and for selecting one of the output of the fifth flip-flop and the output of the first flip-flop according to the second control signal and the inverted second control signal which are inputted as a first channel selection signal and a second channel selection signal respectively; and a seventh flip-flop for receiving an output of the sixth flip-flop as a first and a second input data and for receiving the first control signal as a first and a second channel selection signals wherein the second flip-flop to the fourth flip-flop are inactivated when the sixth flip-flop selects the output of the first flip-flop according to the channel selection signal.

6. A source driver having a shift register unit including a plurality of flip-flops each of which selects one of a first input data and a second input data as a left input data and one of a third input data and a fourth input data as a right input data in response to a first channel selection signal and a second channel selection signal in order to select one of the left input data and the right input data according to a direction selection signal and output the selected signal in synchronization with a clock signal, the source driver comprising:

a first flip-flop for receiving a start signal as a first and a second input data and for receiving an output of a second flip-flop and an output of a third flip-flop as a third input data and a fourth input data respectively to select one of the output of the second flip-flop and the output of the third flip-flop according to a first control signal which is inputted as a first and a second channel selection signals;

the second flip-flop for receiving an output of the first flip-flop as a first and a second input data and for receiving the output of the third flip-flop as a third and a fourth input data and for receiving a second control signal as first and a second channel selection signals;

the third flip-flop for receiving the output of the second flip-flop and the output of the first flip-flop as a first input data and a second input data respectively and for receiving an output of a fourth flip-flop as a third and a fourth input data to select one of the output of the second flip-flop and the output of the first flip-flop according to the second control signal and an inverted second control signal which are inputted as a first channel selection signal and a second channel selection signal respectively; and the fourth flip-flop for receiving the output of the third flip-flop as a first and a second input data and for receiving the start signal as a third and a fourth input data and for receiving the first control signal as a first and a second channel selection signals, wherein each of the first to the fourth flip-flops receives a samee clock signal and a same direction selection signal;

wherein the second flip-flop is inactivated when the direction selection signal is activated and the third flip-flop selects the output of the first flip-flop according to the channel selection signal, wherein the second flip-flop is inactivated when the direction selection signal is inactivated and the first flip-flop selects the output of the third flip-flop according to the channel selection signal.

7. The source driver as recited in claim 6, wherein the flip-flop includes:

an input data selection unit for outputting one of a first input data and a second input data as a left input data and for outputting one of a third input data and a fourth input data as a right input data in response to the first and the second channel selection signals;

a direction selection unit for selecting one of the left input data and the right input data according to the direction selection signal in order to output the selected signal;

a flip-flop element for receiving an output of the direction selection unit in synchronization with the clock signal; and a buffer unit for generating a first active signal and an inverted first active signal by buffering an output signal of the flip-flop element to thereby activate a sampling register unit and for generating a second active signal to thereby activate a next shift register.

8. The source driver as recited in claim 7, wherein the input data selection unit includes:
a first AND gate for receiving the first input data and the first channel selection signal;
a second AND gate for receiving the second input data and the second channel selection unit;
a third AND gate for receiving the third input data and the first channel selection signal;
a fourth AND gate for receiving the fourth input data and the second channel selection signal;
a first NOR gate for receiving an output of the first AND gate and an output of the second AND gate to thereby generate the left input data; and
a second NOR gate for receiving an output of the third AND gate and an output of the fourth AND gate to thereby generate the right input data.

9. The source driver as recited in claim 8, wherein the direction selection unit includes:
a first switch for transferring the right input data according to the direction selection signal;
a second switch for transferring the left input data according to an inverted direction selection signal; and
a first inverter for inverting an output signal outputted from a node commonly coupled by an output of the first switch and an output of the second switch.

10. The source driver as recited in claim 9, wherein the buffer unit includes:
a second and a third inverters for generating the first active signal by delaying the output signal of the flip-flop element;
a fourth inverter for inverting the output signal of the flip-flop element;
a fifth and a sixth inverters for generating the inverted first active signal by delaying an output of the fourth inverter; and
a seventh to a ninth inverters for generating the second active signal by inverting and delaying the output of the fourth inverter.

11. A multi-channel shift register having a plurality of flip-flops connected in series, each of the flip-flops selects one of a first input data and a second input data in response to a first channel selection signal and a second channel selection signal and outputs the selected signal in synchronization with a clock signal, the multi-channel shift register comprising:
a first flip-flop for receiving a start signal as a first and a second input data and for receiving a first control signal as a first and a second channel selection signals;
a second flip-flop for receiving an output of the first flip-flop as a first and a second input data and for receiving a second control signal as a first and a second channel selection signals;
a third flip-flop for receiving an output of the second flip-flop as a first and a second input data and for receiving a third control signal as a first and a second channel selection signals;
a fourth flip-flop for receiving an output of the third flip-flop and the output of the second flip-flop as a first input data and a second input data respectively and for receiving a fourth control signal and the third control signal as a first channel selection signal and a second channel selection signal;
a fifth flip-flop for receiving an output of the fourth flip-flop as a first and a second channel selection signals and for receiving an inverted second control signal as a first and a second channel selection signals;
a sixth flip-flop for receiving an output of the fifth flip-flop and the output of the first flip-flop as a first input data and a second input data respectively and for selecting one of the output of the fifth flip-flop and the output of the first flip-flop according to the second control signal and the inverted second control signal which are inputted as a first channel selection signal and a second channel selection signal respectively; and
a seventh flip-flop for receiving an output of the sixth flip-flop as a first and a second input data and for receiving the first control signal as a first and a second channel selection signals;
wherein the second flip-flop to the fourth flip-flop are inactivated when the sixth flip-flop selects the output of the first flip-flop according to the channel selection signal.

12. A multi-channel shift register having a plurality of flip-flops each of which selects one of a first input data and a second input data as a left input data and one of a third input data and a fourth input data as a right input data in response to a first channel selection signal and a second channel selection signal in order to select one of the left input data and the right input data according to a direction selection signal and output the selected signal in synchronization with a clock signal, the multi-channel shift register comprising:
a first flip-flop for receiving a start signal as a first and a second input data and for receiving an output of a second flip-flop and an output of a third flip-flop as a third input data and a fourth input data respectively to select one of the output of the second flip-flop and the output of the third flip-flop according to a first control signal which is inputted as a first and a second channel selection signals;
the second flip-flop for receiving an output of the first flip-flop as a first and a second input data and for receiving the output of the third flip-flop as a third and a fourth input data and for receiving a second control signal as first and a second channel selection signals;
the third flip-flop for receiving the output of the second flip-flop and the output of the first flip-flop as a first input data and a second input data respectively and for receiving an output of a fourth flip-flop as a third and a fourth input data to select one of the output of the second flip-flop and the output of the first flip-flop according to the second control signal and an inverted second control signal which are inputted as a first channel selection signal and a second channel selection signal respectively; and
the fourth flip-flop for receiving the output of the third flip-flop as a first and a second input data and for receiving the start signal as a third and a fourth input data and for receiving the first control signal as a first and a second channel selection signals,
wherein each of the first to the fourth flip-flops receives a same clock signal and a same direction selection signal;
wherein the second flip-flop is inactivated when the direction selection signal is activated and the third flip-flop selects the output of the first flip-flop according to the channel selection signal,
wherein the second flip-flop is inactivated when the direction selection signal is inactivated and the first flip-flop selects the output of the third flip-flop according to the channel selection signal.

13. The multi-channel shift register as recited in claim 12, wherein the flip-flop includes:

an input data selection unit for outputting one of a first input data and a second input data as a left input data and for outputting one of a third input data and a fourth input data as a right input data in response to the first and the second channel selection signals;

a direction selection unit for selecting one of the left input data and the right input data according to the direction selection signal in order to output the selected signal;

a flip-flop element for receiving an output of the direction selection unit in synchronization with the clock signal; and a buffer unit for generating a first active signal and an inverted first active signal by buffering an output signal of the flip-flop element to thereby activate a sampling register unit and for generating a second active signal to thereby activate a next shift register.

14. The multi-channel shift register as recited in claim 13, wherein the input data selection unit includes:

a first AND gate for receiving the first input data and the first channel selection signal;

a second AND gate for receiving the second input data and the second channel selection unit;

a third AND gate for receiving the third input data and the first channel selection signal;

a fourth AND gate for receiving the fourth input data and the second channel selection signal;

a first NOR gate for receiving an output of the first AND gate and an output of the second AND gate to thereby generate the left input data; and a second NOR gate for receiving an output of the third AND gate and an output of the fourth AND gate to thereby generate the right input data.

15. The multi-channel shift register as recited in claim 14, wherein the direction selection unit includes:

a first switch for transferring the right input data according to the direction selection signal;

a second switch for transferring the left input data according to an inverted direction selection signal; and a first inverter for inverting an output signal outputted from a node commonly coupled by an output of the first switch and an output of the second switch.

16. The multi-channel shift register as recited in claim 15, wherein the buffer unit includes:

a second and a third inverters for generating the first active signal by delaying the output signal of the flip-flop element;

a fourth inverter for inverting the output signal of the flip-flop element;

a fifth and a sixth inverters for generating the inverted first active signal by delaying an output of the fourth inverter and a seventh to a ninth inverters for generating the second active signal by inverting and delaying the output of the fourth inverter.

* * * * *

UNITED STATES PATENT AND TRADEMARK OFFICE
CERTIFICATE OF CORRECTION

| | | |
|---|---|---|
| PATENT NO. | : 7,650,373 B2 | Page 1 of 1 |
| APPLICATION NO. | : 11/218222 | |
| DATED | : January 19, 2010 | |
| INVENTOR(S) | : Jung | |

It is certified that error appears in the above-identified patent and that said Letters Patent is hereby corrected as shown below:

Title Page, section (73), Assignee, delete "Chungcheonbuk-Do" and insert -- Chungcheongbuk-Do --

Signed and Sealed this

Thirteenth Day of July, 2010

David J. Kappos
*Director of the United States Patent and Trademark Office*